(12) United States Patent
Ueda

(10) Patent No.: US 7,436,211 B2
(45) Date of Patent: Oct. 14, 2008

(54) TRANSPARENT LATCH CIRCUIT

(75) Inventor: Makoto Ueda, Kyoto (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/710,185

(22) Filed: Jun. 24, 2004

(65) Prior Publication Data
US 2005/0005214 A1 Jan. 6, 2005

(30) Foreign Application Priority Data
Jun. 27, 2003 (JP) ............... 2003-185054

(51) Int. Cl.
G06F 7/38 (2006.01)
H03K 19/173 (2006.01)
G01R 31/28 (2006.01)

(52) U.S. Cl. ............... 326/46; 326/16; 326/93; 714/726; 714/727; 714/729

(58) Field of Classification Search ............ 326/16, 326/46, 93; 714/726, 727, 729
See application file for complete search history.

(56) References Cited

U.S. PATENT DOCUMENTS

| 5,406,216 A * | 4/1995 | Millman et al. ............ 327/202 |
| 5,596,584 A * | 1/1997 | Warren ............ 714/726 |
| 2004/0078741 A1 * | 4/2004 | Morton ............ 714/726 |

* cited by examiner

Primary Examiner—Rexford Barnie
Assistant Examiner—Dylan White
(74) Attorney, Agent, or Firm—William D. Sabo; W. Riyon Harding

(57) ABSTRACT

The present invention provides a transparent latch circuit capable of performing a scan test in general scan design (GSD). In the transparent latch circuit a test signal is at a Low level during normal operation. Since a latch stop circuit outputs a High-level latch stop signal, a slave latch circuit has a received signal pass through it directly and a master latch circuit operates as a latch circuit in response to a signal output from an inverter. On the other hand, a test signal is at a High level during scan test. At this point, the latch stop circuit outputs a signal complementary to the signal output from the inverter. Therefore, the master latch circuit and the slave latch circuit operate as latch circuits responding to signals complementary to each other. Thereby, the entire transparent latch circuit operates as a flip-flop circuit.

5 Claims, 8 Drawing Sheets

TRANSPARENT LATCH CIRCUIT

BACKGROUND OF INVENTION

1. Background of the Invention

The present invention relates to a transparent latch circuit, and more particularly, to a transparent latch circuit for which a scan test is enabled.

2. Background Art

A large and complicated semiconductor device includes a plurality of transparent latch circuits and a plurality of flip-flop circuits. A transparent latch circuit TL is shown in FIG. 7, and a flip-flop circuit FF is shown in FIG. 8. The flip-flop circuit FF is constituted by two transparent latch circuits TL.

A scan test is conducted to determine whether a fault has occurred in a logic circuit (hereinafter referred to as a logic cone). For the scan test, a plurality of flip-flop circuits in a semiconductor device are connected in series to form a shift register, and a signal (a function data signal) output by a desired logic cone is shifted sequentially by the shift register, and is output externally. Designing a semiconductor device on the assumption of this scan test is called scan design, and the state wherein the flip-flop circuits are connected in series for the scan test is called a scan path.

As scan designs, there are a GSD (a General Scan Design) prepared on the assumption a scan test will be performed using a one-phase clock signal, and an LSSD (a Level Sensitive Scan Design) prepared on the assumption of a scan test using a two-phase clock signal. The merit of the LSSD is that no timing error will occur because a scan test will be conducted by using two independent clock signals; however, once the circuit structure has been completed, the size of the circuit will be increased. On the other hand, the circuit structure of the GSD can be simplified, compared with that of the LSSD, and the size of the circuit can be reduced.

However, since according to the GSD a one-phase signal is employed, the transparent latch circuits TL, which hold signals or permit the signal to pass through, in consonance with the level (H or L) of the clock signal, can not be used as part of the scan chain, while the plurality of flip-flop circuits FF that read or output signals at the leading (or trailing) edge of the clock signal are employed as part of the scan chain.

While referring to FIG. 9, an explanation will be given for the performance of a scan test when a plurality of flip-flop circuits FF1 to FF5 in a semiconductor device are located between logic cones 500 and 501. A signal (a function data signal DI) output by the logic cone 500 is transmitted through multiplexers MP1 to MP5 to the respective flip-flop circuits FF1 to FF5. During a scan test, the flip-flop circuits FF1 to FF5 are connected in series to form a scan chain. The function data signal output by a combinational circuit 400 in the logic cone 500 is transmitted through the multiplexer MP1 to the flip-flop circuit FF1, and following this, the multiplexer MP1 selects a scan data signal SI and transmits this signal SI to the flip-flop circuit FF1. Based on a clock signal CLK, the function data signal DI is sequentially shifted from the flip-flop circuit FF1 to FF2 and then to FF3, and finally, is output by an output node 502. In this manner, when the scan chain is formed of multiple flip-flop circuits FF1 to FF5, the scan data signal DI transmitted by a desired combinational circuit 400 can be output externally.

However, when as is shown in FIG. 10 a transparent latch circuit TL is provided for the scan chain instead of the flip-flop circuit FF1, the scan chain does not function as a shift register. At the succeeding stage, the transparent latch circuit TL can not transmit, to the flip-flop circuit FF2, data received at the leading edge or the trailing edge of the clock signal CLK.

Therefore, when the transparent latch circuit TL is arranged instead of the flip-flop circuit FF1, at the scan test time, a test signal TE is externally received by the transparent latch circuit TL, so that the transparent latch circuit TL is used as a through buffer, and the flip-flop circuits FF2 to FF5 constitute the scan chain. As a result, the function data signal DI transmitted by the combinational circuit 400 can not be output externally.

When the transparent latch circuit TL is considered to be part of the logic cone 500, output data can not be uniquely defined relative to input data for the logic cone 500 that includes the transparent circuit TL. This is true because, since the transparent circuit TL permits data to pass through, a loop is generated. Therefore, the transparent latch circuit TL can not also be regarded as part of the logic cone 500.

Thus, according to the GSD, a scan test can not be performed for the wrapper or cycle stealing, of a memory circuit that employs the transparent latch circuit. And as a result, overall test coverage of the semiconductor device is reduced.

The following references are noted:
Japanese Laid-Open Patent Publication No. Hei 4-216643;
Japanese Laid-Open Patent Publication No. Hei 3-111776;
Japanese Laid-Open Patent Publication No. Sho 60-254740; and
Japanese Laid-Open Patent Publication No. Sho 57-106238.

SUMMARY OF INVENTION

It is one objective of the present invention to provide a transparent latch circuit capable of performing a scan test in the GSD.

A transparent latch circuit according to the present invention comprises a first latch circuit, a second latch circuit and latch stop means. The first latch circuit receives a data signal, and latches the data signal in response to the periodic fluctuation of a first signal. The second latch circuit receives a signal output by the first latch circuit, and latches that signal in response to a second signal complementary to the first signal. The latch stop means receives an externally input test signal, and when the test signal is in an active state, permits one of the first and the second latch circuits to let the signal received by the latch circuit pass through.

According to this invention, when a test signal is in the inactive state, the transparent latch circuit selects the first or the second latch circuit to act as a latch circuit and let the signal, received by the other latch circuit, pass through. Therefore, during a normal operation, wherein the test signal is in the inactive state, the transparent latch circuit serves as a latch circuit. And when the test signal is in the active state, both the first and the second latch circuits serve as latch circuits; the first latch circuit latches a signal in response to a first signal, and the second latch circuit latches a signal in response to a second signal, one complementary to the first signal. As a result, during a scan test operation wherein the test signal is in the active state, the transparent latch circuit serves as a flip-flop circuit. Therefore, the scan test operation can be performed based on only the first signal, so that the scan test is enabled, even in the GSD.

Preferably, the latch stop means includes:
a logic gate for receiving the first signal and the test signal, for outputting the second signal when the test signal is in the active state, and for outputting a latch stop signal when the test signal is in the inactive state. During a period wherein the second latch circuit receives a latch stop signal, the second latch circuit permits the signal output by the first latch circuit to pass through.

With this configuration, during a normal operation wherein the test signal is in the inactive state, the second latch circuit receives a latch stop signal from the latch stop means, and therefore, while the first latch circuit serves as a latch circuit, the second latch circuit permits the received signal to pass through. Then, when the test signal is in the active state at the scan test time, the second latch circuit receives the signal complementary to the first signal and serves as a latch circuit. As a result, the transparent latch circuit can function as a flip-flop circuit during a scan test, and the scan test can be performed based on the first signal.

Preferably, the latch stop means includes:

a logic gate for receiving the second signal and the test signal, and for outputting the first signal when the test signal is in the active state and for outputting a latch stop signal when the test signal is in the inactive state. During a period wherein the first latch circuit receives the latch stop signal, the first latch circuit permits a data signal to pass through.

With this arrangement, during a normal operation wherein the test signal is in the inactive state, the first latch circuit receives the latch stop signal from the latch stop means, and therefore, the first latch circuit permits the received signal to pass through while the second latch circuit serves as a latch circuit. Then, when the test signal is in the active state at the scan test time, the first latch circuit receives the first signal complementary to the second signal and serves as a latch circuit. As a result, the transparent circuit functions as a flip-flop circuit for a scan test, and the scan test can be performed based on the second signal.

Preferably, the latch stop means includes first latch stop means and second stop means. When the test signal is in the inactive state, the first latch stop means permits a signal received by the first latch circuit to pass through, and the second latch stop means permits a signal received by the second latch circuit to pass through. The transparent latch circuit further comprises: a first transparent latch circuit and a second transparent latch circuit. The first transparent latch circuit includes first latch stop means, and the second transparent latch circuit includes second latch stop means. The first and second transparent latch circuits are alternately interconnected.

When a normal operation is to be performed by connecting a plurality of first transparent latch circuits, or by connecting a plurality of second transparent latch circuits, a circuit device must be inserted in order to invert the first signal between the adjacent transparent latch circuits. However, upon the insertion of the circuit device clock skew occurs. And therefore, according to the transparent latch circuit of the invention, the first and the second transparent latch circuits are alternately connected to avoid having to insert the circuit device between the transparent latch circuits. As a result, the occurrence of clock skew can be prevented.

BRIEF DESCRIPTION OF DRAWINGS

The foregoing and other objects, aspects and advantages will be better understood from the following detailed description of the preferred embodiments of the invention with reference to the drawings, in which.

DETAILED DESCRIPTION

Figure 1:
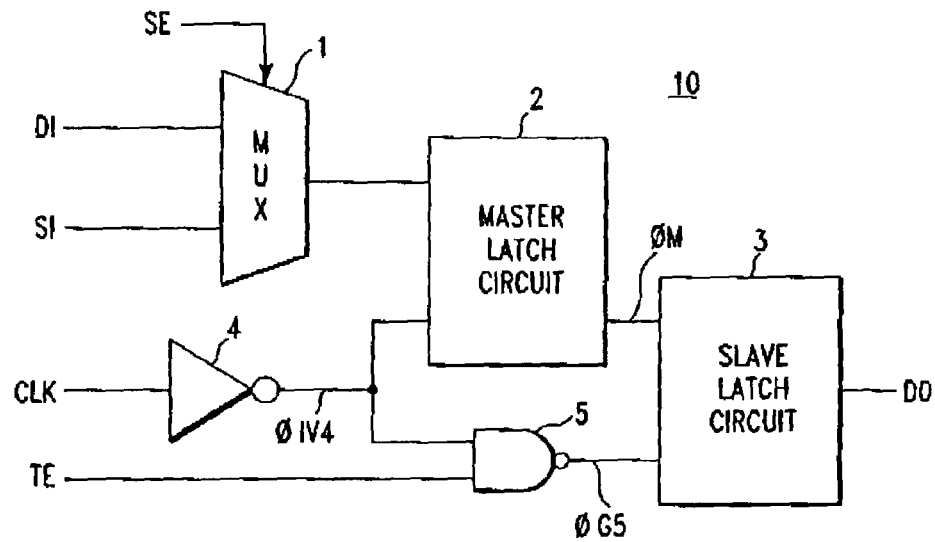
FIG. 1 is a block diagram showing the configuration of a transparent latch circuit according to a first embodiment of the invention.

The preferred embodiments of the invention will now be described in detail while referring to the drawings. The same reference numerals are used throughout to denote identical or corresponding components, and no explanation for them will be given.

FIRST EMBODIMENT

While referring to FIG. 1, a transparent latch circuit 10 comprises a multiplexer (MUX) 1, a master latch circuit 2, a slave latch circuit 3, an inverter 4 and a latch stop circuit 5.

The MUX 1 receives a function data signal DI and a scan data signal SI, and selects a signal to be output to the master latch circuit 2. Specifically, the MUX 1 receives a select signal SE from a controller (not shown), and when the select signal SE level is L, the MUX 1 outputs the function data signal DI to the master latch circuit 2, while when the select signal SE level is H, the MUX 1 outputs the scan data signal SI to the master latch circuit 2. The inverter 4 receives a clock signal CLK, inverts the signal CLK and outputs the inverted signal as a signal $\phi IV4$, and the latch stop circuit 5, constituted by a NAND gate, receives the signal $\phi IV4$ and a test signal TE and outputs the NAND of these signals. Specifically, when the test signal TE level is L, the latch stop circuit 5 outputs a level H latch stop signal $\phi G5$. When the test signal TE level is H, the latch stop circuit 5 outputs, as a signal $\phi G5$, a signal complementary to the signal $\phi IV4$.

Figure 2:
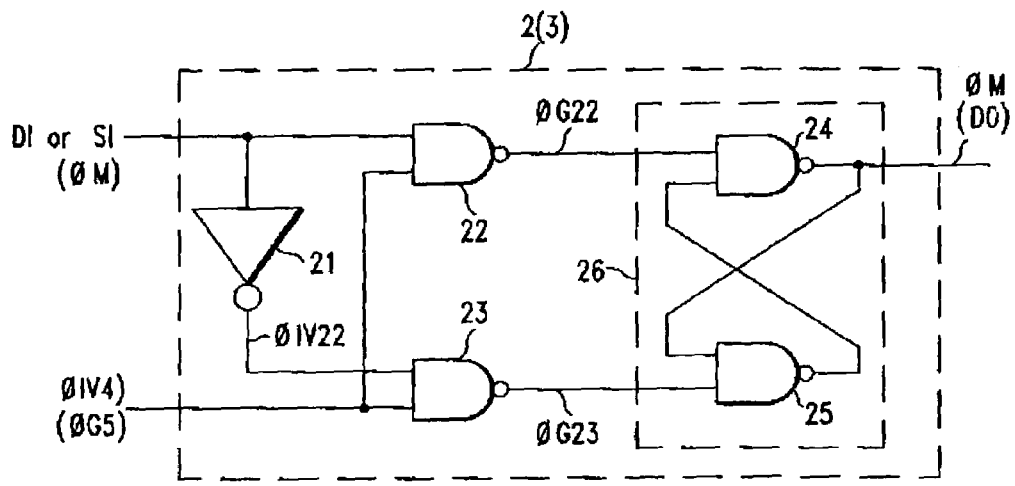
FIG. 2 is a detailed circuit diagram showing the arrangement of a master latch circuit in FIG. 1.

While referring to FIG. 2, the master latch circuit 2 includes NAND gates 22 to 25 and an inverter 21. The NAND gate 22 receives a signal (the function data signal DI or the scan data signal SI) from the MUX 1 and the signal $\phi IV4$ from the inverter 4, and outputs the NAND of these signals as a signal $\phi G22$.

The NAND gate 23 receives the signal $\phi IV21$ from the inverter 21 and the signal $\phi IV4$, and outputs the NAND of these signals as a signal $\phi G23$. The inverter 21 receives a signal (the function data signal DI or the scan data signal SI) from the MUX 1, and inverts the signal. The NAND gates 24 and 25 constitute an SR latch circuit 26. The NAND gate 24 of the SR latch circuit 26 has two input terminals; one terminal is connected to the output terminal of the NAND gate 22, and the other is connected to the output terminal of the NAND gate 25. The NAND gate 25 has two input terminals; one terminal is connected to the output terminal of the NAND gate 23, and the other is connected to the output terminal of the NAND gate 24.

When the signal $\phi G22$ level is H, and the signal $\phi G23$ level is L, the SR latch circuit 26 outputs a signal $\phi M$ at level L.

When the signal φG22 level is L and the signal φG23 level is H, the SR latch circuit 26 outputs a signal φM at level H. When both of the signals φG22 and φG23 are at level H, the SR latch circuit 26 latches the signal φM.

The structure of the slave latch circuit 3 is the same as that of the master latch circuit 2. It should be noted that in the slave latch circuit 3 a NAND gate 22 receives the signal φM from the master latch circuit 2 and the signal φG5 from the latch stop circuit 5; a NAND gate 23 receives the signal φIV21 from an inverter 21, which inverts the signal φM, and the signal φG5 from the latch stop circuit 5; and an SR latch circuit 26 outputs a signal DO.

An explanation will now be given for a normal operation and the scan test operation performed by the thus arranged transparent latch circuit 10.

Normal operation of the transparent latch circuit During a normal operation, the test signal TE level is L. Then, since the select signal SE received by the MUX 1 is at level L, the MUX 1 selects the function data signal DI and the master latch circuit 2 receives the function data signal DI. At this time, the master latch circuit 2 in the transparent latch circuit 10 serves as a latch circuit, and the slave latch circuit 3 simply lets the received signal pass through. This processing will be described in detail below.

(1) Case Wherein the Clock Signal CLK Drops from Level H to Level L

When the clock signal CLK drops from level H to level L, the signal φIV4 output by the inverter 4 goes to level H. At this time, while the function data signal DI is at level L, the signal φG22 output by the NAND gate 22 goes to level H and the signal φG23 output by the NAND gate 23 goes to level L. As a result, the SR latch circuit 26 outputs the signal φM at level L. When the function data signal DI is at level H, the signal φG22 goes to level L and the signal φG23 goes to level H. As a result, the SR latch circuit 26 outputs the signal φM at level H. Therefore, when the clock signal CLK drops from level H to level L, the master latch circuit 2 outputs the function data signal D1 as the signal φM.

At this time, the slave latch circuit 3 lets the signal φM received from the master latch circuit 2 pass through, and outputs the signal as the signal DO. Specifically, during a normal operation, since the test signal TE is at level L, the latch stop circuit 5 outputs the latch stop signal φG5 at level H. When the signal φM is at level H, the signal φG22 output by the NAND gate 22 goes to level L, and the signal φG23 output by the NAND gate 23 goes to level H, so that the SR latch circuit 26 outputs the signal DO at level H. When the signal φM is at level L, the signal φG22 goes to level H, while the signal φG23 goes to level L, and the SR circuit 26 outputs the signal DO at level L. Therefore, the received signal φM passes through the slave latch circuit 3, which outputs the signal as the signal DO.

(2) Case Wherein the Clock Signal CLK Rises from Level L to Level H

When the clock signal CLK rises from level L to level H, the master latch circuit 2 latches the signal φM. Specifically, since the signal φIV4 goes to level L, the signals φG22 and φ23 output by the NAND gates 22 and 23 in the master latch circuit 2 go to level H. Therefore, the SR latch circuit 26 latches the signal φM.

At this time, since the test signal TE is at level L, the latch stop circuit 5 outputs the latch stop signal φG5 at level H. Thus, the received signal φM passes through the slave latch circuit 3, which outputs the signal as the signal DO.

In this manner, during a normal operation, the master latch circuit 2 in the transparent latch circuit 10 serves as a latch circuit and the received signal φM is passed through the slave latch circuit 3. Therefore, overall, the transparent latch circuit 10 functions as a latch circuit.

Figure 3:
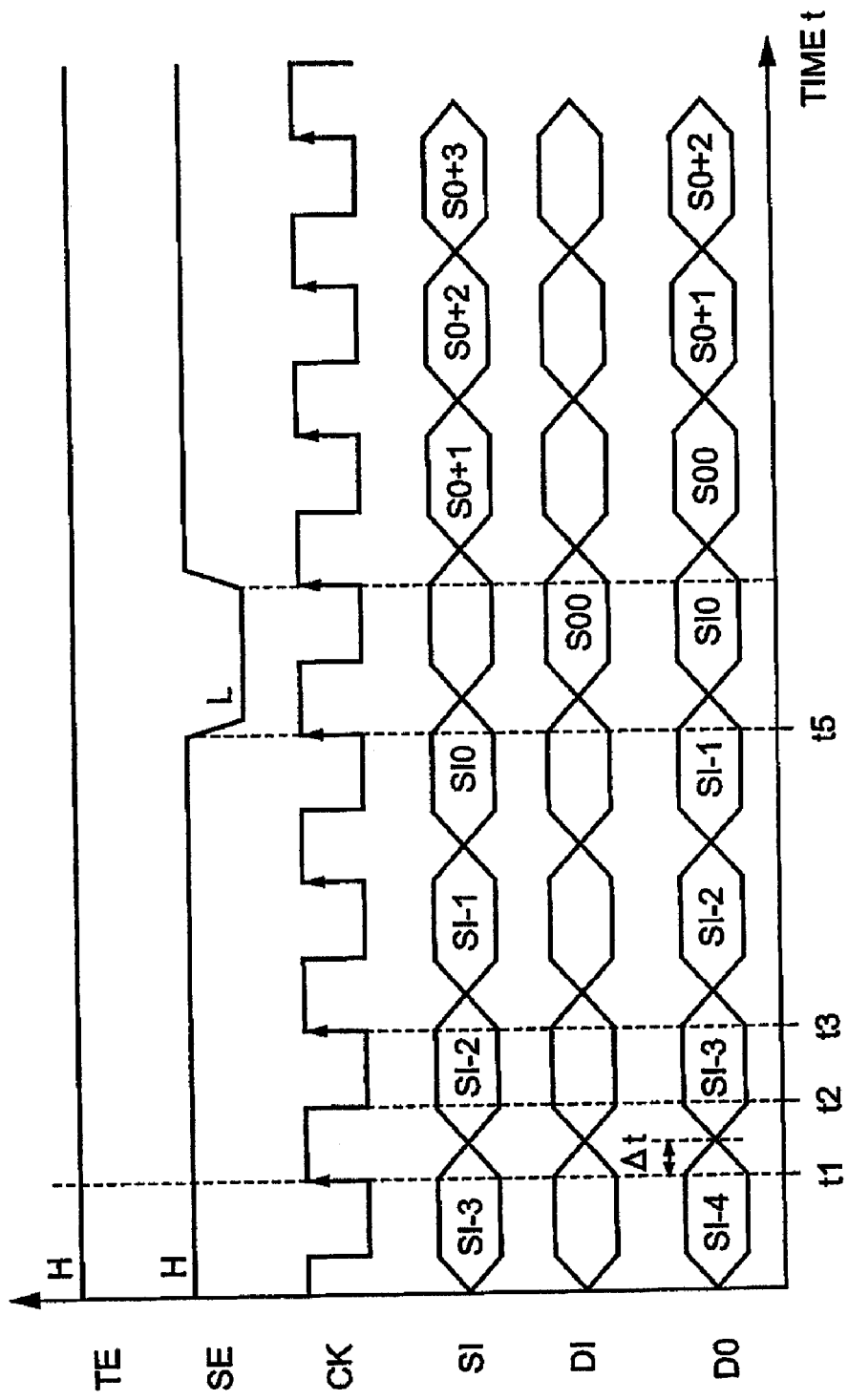
FIG. 3 is a timing chart showing the scan test operation for the transparent latch circuit in FIG. 1.

Test scan operation of the transparent latch circuit Referring to FIG. 3, the test signal TE goes to level H during the test scan operation. Further, since the scan data signal SI is employed for the test scan, the select signal SE also goes to level H. Then, when at time t1 the clock signal CLK goes to level H, the signal φIV4 output by the inverter 4 goes to level L. At this time, since the select signal SE is at level H, the MUX 1 selects the scan data signal SI. In the master latch circuit 2, the NAND gates 22 and 23 receive the signal φIV4 at level L, and outputs the signals φG22 and φG23 at level H. As a result, the SR latch circuit 26 latches the signal φM. Further, since, at time t1, the master latch circuit 2 receives a scan data signal SI-3, the signal φM is equal to the scan data signal SI-3. Thus, during the period (from time t1 to t2) wherein the clock signal CLK is at level H, the master latch circuit 2 continues to latch the scan data signal SI-3.

Focusing on the operation of the slave latch circuit 3 during the period from time t1 to t2, the latch stop circuit 5 receives the test signal TE at level H and the signal φIV4 at level L, and outputs the signal φG at level H. When the slave latch circuit 3 receives the signal φM at level H, the NAND gate 22 receives the signal φG5 at level H and the signal φM at level H, and outputs the signal φG22 at level L. Further, the NAND gate 23 receives the signal φIV21 at level H and the signal φG5 at level H, and outputs the signal φG23. As a result, the SR latch circuit 26 outputs the signal DO at level H. On the other hand, when the slave latch circuit 3 receives the signal φM at level L, the NAND gate 22 outputs the signal φG22 at level H, and the NAND gate 23 outputs the signal φG23 at level L. As a result, the SR latch circuit 26 outputs the signal DO at level L. Therefore, with a delay of γt following time t1, the output signal DO goes to the same level as the signal φM (i.e., the scan data signal SI-3). The delay γt is generated using the time constant for the transparent latch circuit 10.

The operation of the transparent latch circuit 10 during the period from time t2 to t3 will now be described. When the clock signal CLK goes to level L at time t2, the signal φIV4 input to the NAND gates 22 and 23 of the master latch circuit 2 goes to level H. Therefore, the scan test data signal SI, received during the period from time t2 to t3, is passed through the SR latch circuit 26, in the master latch circuit 2, that outputs this signal SI unchanged.

At time t2, the slave latch circuit 3 receives the signal φG5 at level L, and the signals φG22 and φG23, output by the NAND gates 22 and 23 in the slave latch circuit 3, go to level H. Therefore, until time t3, in the slave latch circuit 3, the SR latch circuit 26 latches the signal φM (i.e., the scan data signal SI-3) received by the slave latch circuit 3. Following time t3, the operation performed during the period from time t1 to t2 is repeated.

At time t5, the select signal SE goes to level L, and the MUX 1 selects a function data signal SO0 that is then output to the master latch circuit 2. This is the result of observations made of the output of a logic cone encompassing a plurality of the transparent latch circuits 10. At this time, since the test signal TE is maintained at level H, the master latch circuit 2 and the slave latch circuit 3 perform the same operations as when the scan data signal SI is received.

Through the above described processing performed, during a scan test operation, at the leading edge of the clock signal CLK, the master latch circuit 2 in the transparent latch circuit 10 latches the received scan data signal SI, and the received signal φM is passed through the slave latch circuit 3. At the trailing edge of the clock signal CLK, the received scan data signal SI passes through the master latch circuit 2, and the slave latch circuit 3 latches the output signal DO. Thus, the transparent latch circuit 10 functions as a flip-flop circuit.

According to this embodiment, since in the scan test operation the transparent latch circuit 10 serves as a flip-flop circuit, a one-phase clock can be employed to perform the scan test, and during a normal operation, the transparent latch circuit 10 can be used as a latch circuit. Therefore, since the transparent latch circuit 10 of this embodiment is employed as a RAM wrapper or for cycle stealing, the scan test can be performed using a one-phase signal, and the test coverage in the GSD can be improved.

SECOND EMBODIMENT

According to the transparent latch circuit 10 of the first embodiment, upon receiving the latch stop signal φG5 during a normal operation, the latch the slave latch circuit 3 lets a received signal pass through, and the master latch circuit 2 serves as a latch circuit. However, during a normal operation, the master latch circuit may let a received signal pass through, and the latch circuit 3 may serve as a latch circuit.

Figure 4:
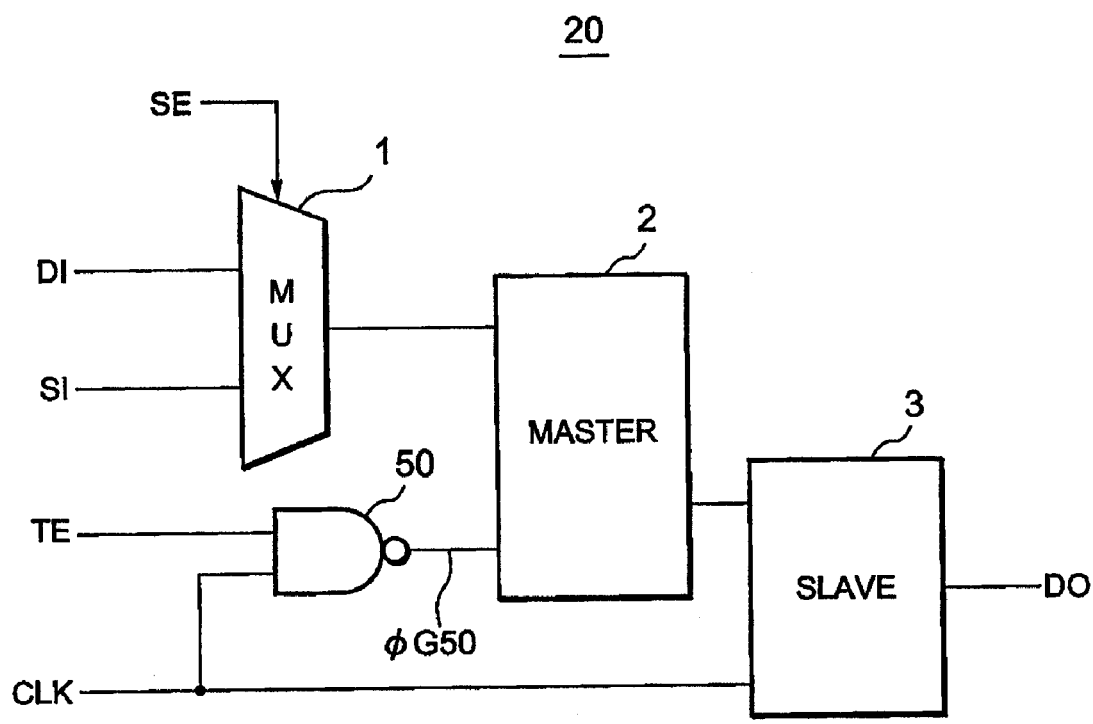
FIG. 4 is a block diagram showing the configuration of a transparent latch circuit according to a second embodiment of the invention.

While referring to FIG. 4, a transparent latch circuit 20 comprises a latch stop circuit 50, instead of the inverter 4 and the latch stop circuit 5 of the transparent latch circuit 10. The latch stop circuit 50 has two input terminals, at one of which it receives a test signal TE and at the other, a clock signal CLK. Thereafter, a NAND of the test signal TE and the clock signal CLK is obtained and output by the latch stop circuit 50. Specifically, when the test signal TE is at level L, the latch stop circuit 50 outputs a latch stop signal φG50 at level H. And when the test signal is at level H, the latch stop circuit 50 outputs a signal/CLK that is complementary to the clock signal CLK. The output signal of the latch stop circuit 50 is transmitted to NAND gates 22 and 23 of a master latch circuit 2, while the clock signal φCLK is transmitted to NAND gates 22 and 23 of a slave latch circuit 3. The other components of the structure are the same as those for the transparent latch circuit 10.

Using this circuit configuration for the transparent latch circuit 20, during a normal operation, the latch stop circuit 50 outputs the latch stop signal φG50, and as a result, a received function data signal DI is passed through the master latch circuit 2. At this time, the slave latch circuit 3 receives the clock signal CLK, and serves as a latch circuit. During the scan test operation, the latch stop circuit 50 outputs the signal/CLK while the master latch circuit 2 and the slave latch circuit 3 function as latch circuits, and overall, the transparent latch circuit 20 serves as a flip-flop circuit. Since the transparent latch circuit 20 serves as a latch circuit during a normal operation, and serves as a flip-flop circuit during the scan test operation, the test coverage can be improved for the GSD, for which the scan test is performed using a one-phase signal.

Third Embodiment According to the first and the second embodiments, the transparent latch circuits 10 and 20 function as latch circuits during a normal operation, and function as flip-flop circuits during a scan test operation, so that a scan test is enabled for the GSD.

When the two transparent latch circuits 10 of the first embodiment are connected, this circuit structure can be operated as a flip-flop circuit, even during a normal operation. Specifically, when at the preceding stage the master latch circuit 2 in the transparent latch circuit 10 latches the function data signal DI, at the succeeding stage an input signal is passed through the master latch circuit 2 in the transparent latch circuit 10, while when at the preceding stage the function data signal DI passes through the master latch circuit 2 of the transparent latch circuit 10, at the succeeding stage the master latch circuit 2 of the transparent latch circuit 10 latches the output signal DO. As for the transparent latch circuit 20, the same arrangement is employed as that used in the second embodiment.

In order to perform the above described operation, a circuit device for inverting the clock signal CLK must be inserted between the transparent latch circuits at the two stages. However, since clock skew would occur upon the insertion of the circuit device, and since an erroneous operation may occur as a result of the clock skew, it is preferable that the clock skew be prevented.

Figure 5:
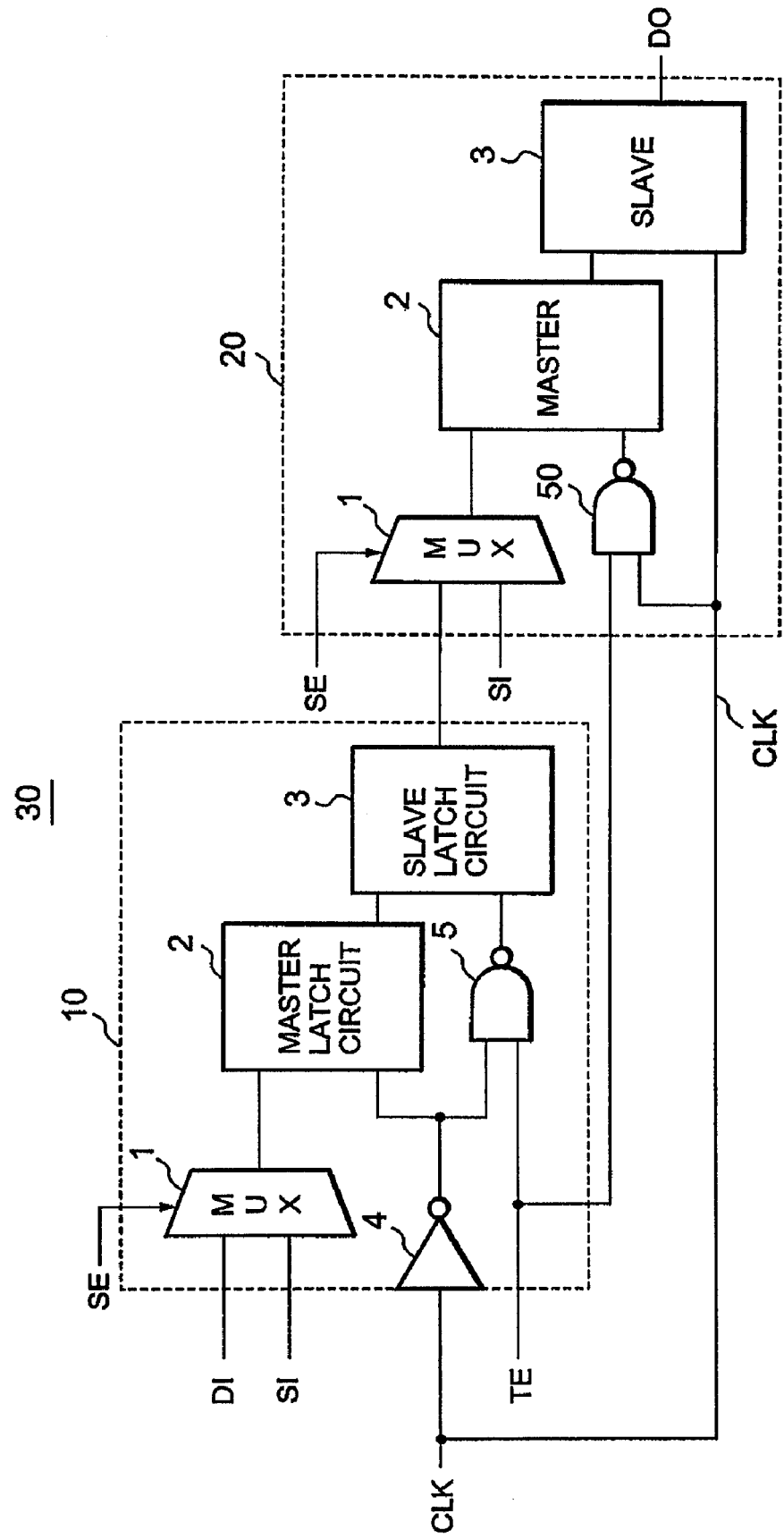
FIG. 5 is a block diagram showing the configuration of a transparent latch circuit according to a third embodiment of the invention.

As is shown in FIG. 5, a transparent latch circuit 30 according to a third embodiment is a combination of the transparent latch circuits 10 and 20. Specifically, the output terminal of the slave latch circuit 3 of the transparent latch circuit 10 is connected to the function data signal DI input terminal of the MUX1 of the transparent latch circuit 20, and the input terminal of the inverter 4 of the transparent latch circuit 10 is connected to the clock signal CLK input terminal of the transparent latch circuit 20. Normal operation of the transparent latch circuit 30 in FIG. 5 will now be explained.

Figure 6:
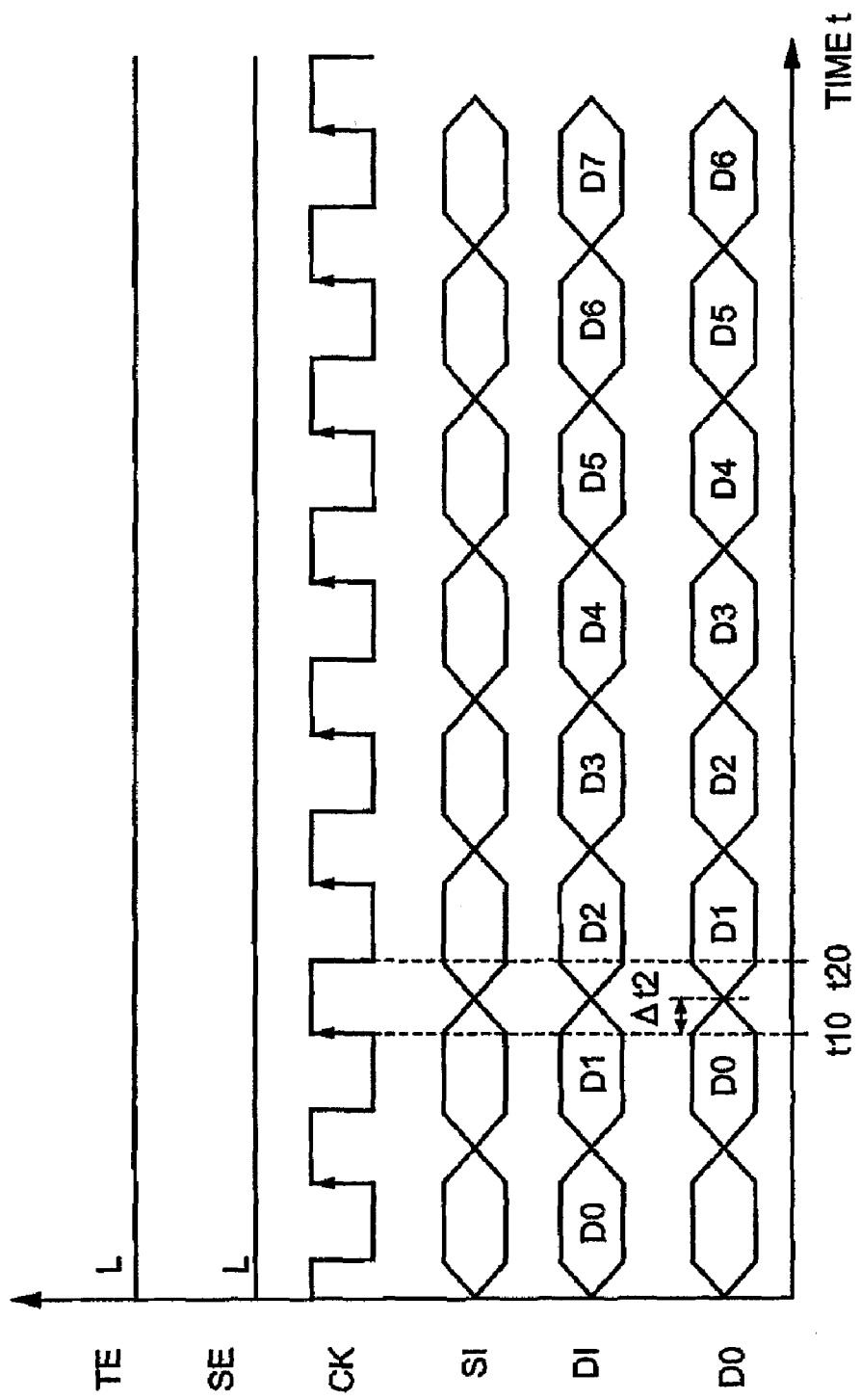
FIG. 6 is a timing chart showing the a normal operation for the transparent latch circuit in FIG. 5.
Figure 7:
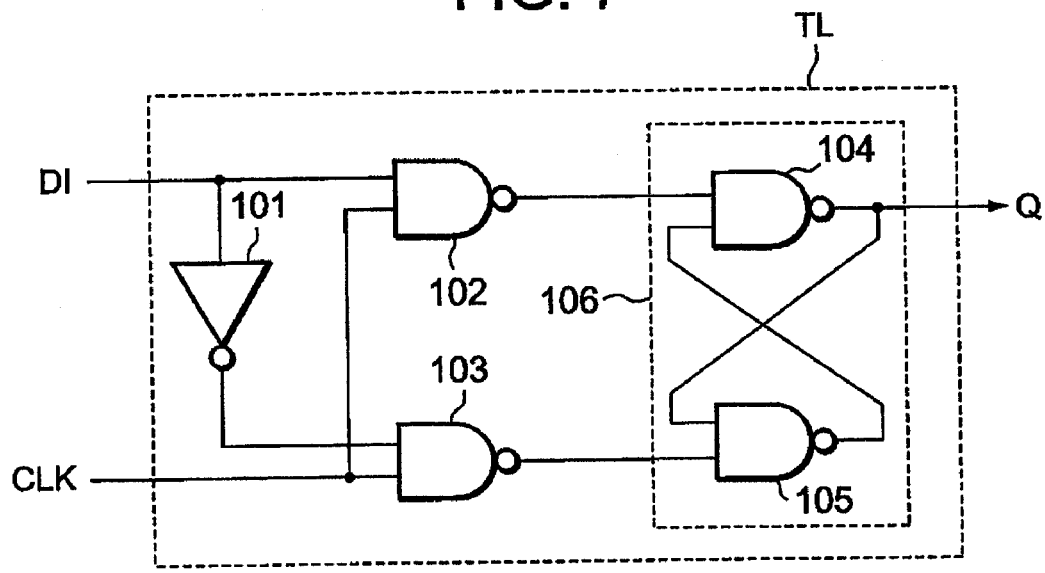
FIG. 7 is a block diagram showing the configuration of a conventional transparent latch circuit.
Figure 8:
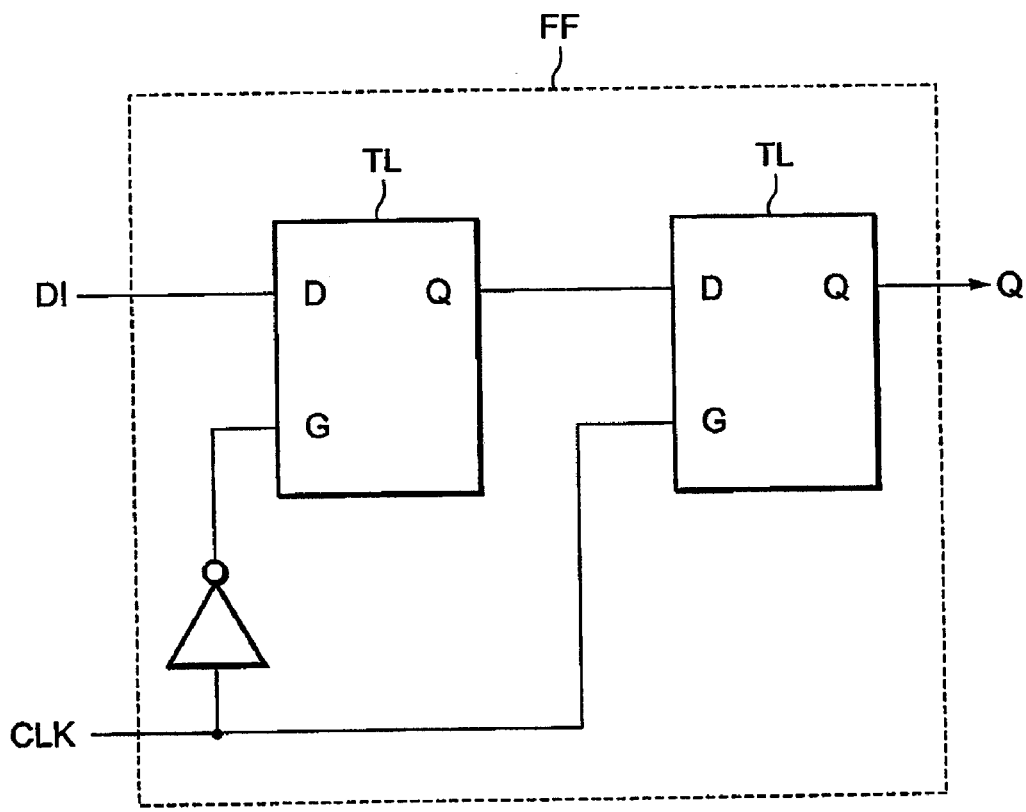
FIG. 8 is a circuit diagram showing the arrangement of a conventional flip-flop circuit.
Figure 9:
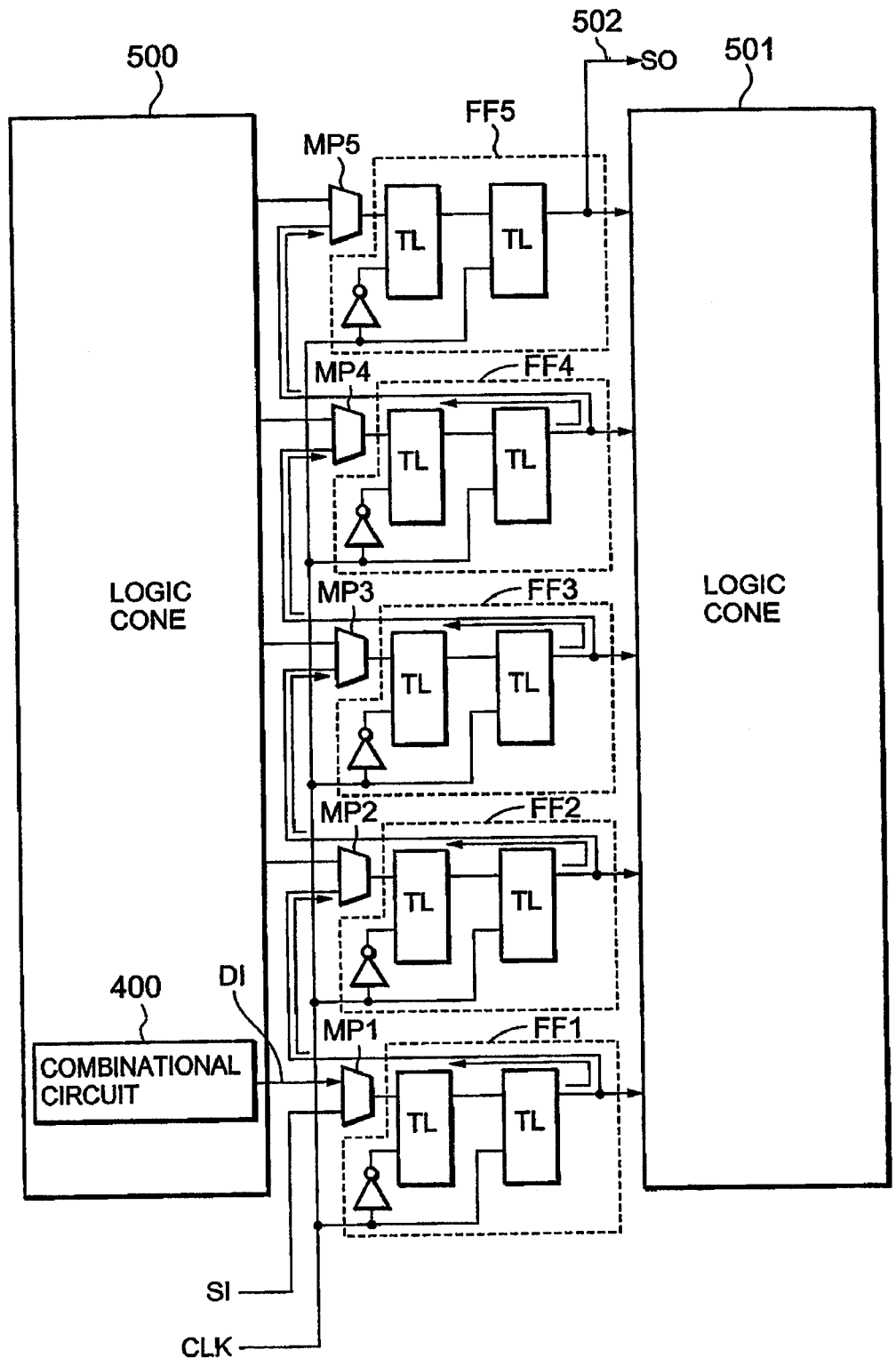
FIG. 9 is a block diagram for explaining a scan test.
Figure 10:
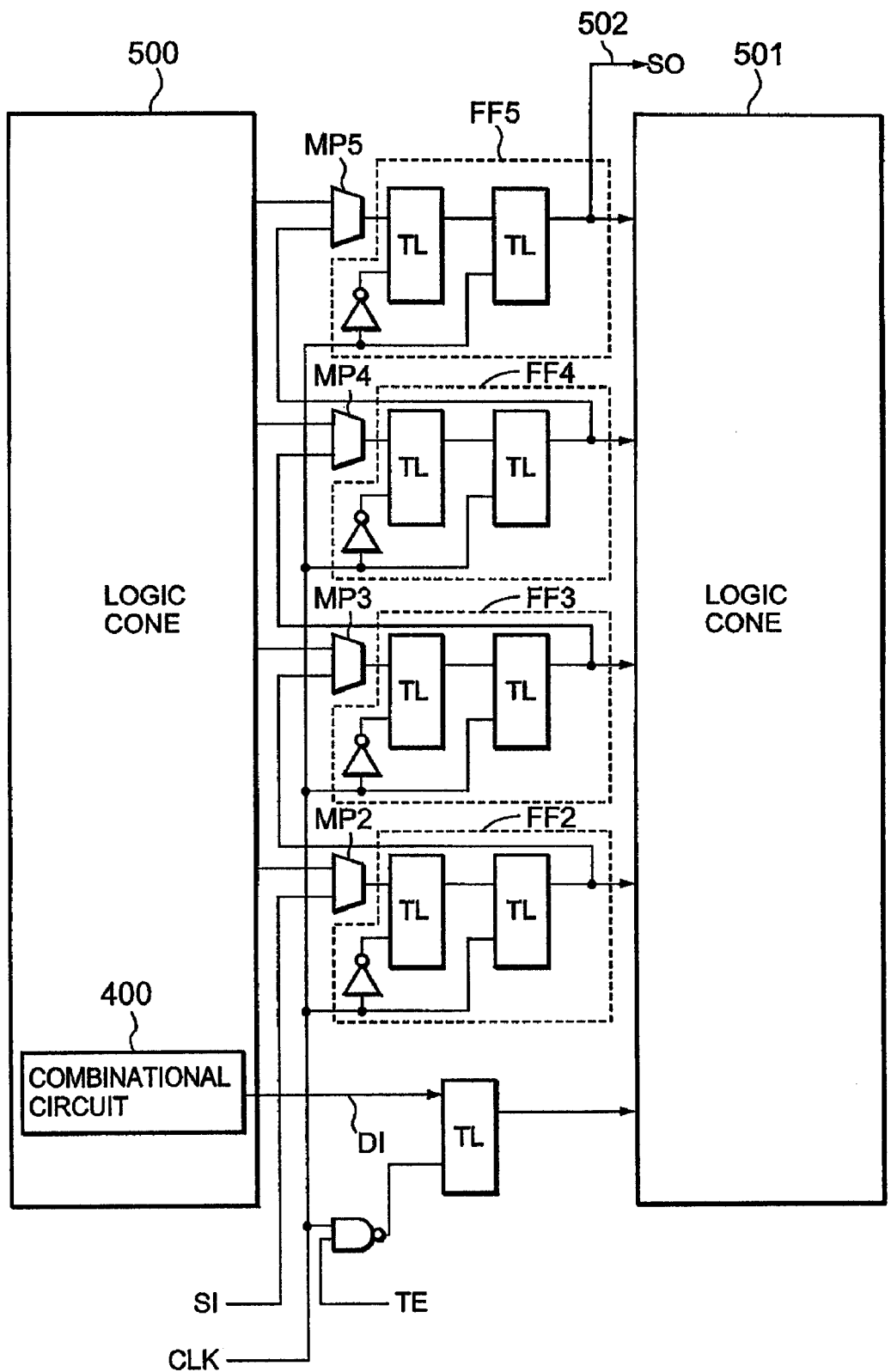
FIG. 10 is another block diagram for explaining a scan test.

While referring to FIG. 6, during a normal operation, a test signal TE input to the transparent latch circuit 30 goes to level L. As a result, the slave latch circuit 3 of the transparent latch circuit 10 receives a latch stop signal φG5 from the latch stop circuit 5, permits the signal φM, received from the master latch circuit 2, to pass through continuously, and outputs the signal φM to the transparent latch circuit 20. Therefore, in the transparent latch circuit 10, only the master latch circuit 2 serves as a latch circuit. In the transparent latch circuit 20, the master latch circuit 2 receives the latch stop signal φG50 from the latch stop circuit 50, permits the signal received from the transparent latch circuit 10 to pass through, and outputs the signal to the slave latch circuit 3, which serves as a latch circuit of the transparent latch circuit 20.

Therefore, during a normal operation, in the transparent latch circuit 30, the master latch circuit 2, in the transparent latch circuit 10, and the slave latch circuit 3, in of the transparent latch circuit 20, function as latch circuits. When the clock signal CLK goes to level H at time t10, the signal φIV4 input to the master latch circuit 2, in the transparent latch circuit 10, goes to level L, while the clock signal CLK input to the slave latch circuit 3, in the transparent latch circuit 20, is at level H. Therefore, during the time period t10 to t20, the master latch circuit 2 in the transparent latch circuit 10 latches a received function data signal DI, and after a delay of γt2 from time t10, in accordance with the time constant, the slave latch circuit 3 in the transparent latch circuit 3 passes the function data signal DI through.

When the clock signal CLK goes to level L at time t20, the master latch circuit 2 in the transparent latch circuit 10 passes a received function data signal D2 through, while the slave latch circuit 3 in the transparent latch circuit 20 latches an output signal DO (function data signal D1). As a result, during a normal operation, the transparent latch circuit 30 functions as a flip-flop circuit. Further, since a circuit device for inverting the clock signal CLK need not be arranged between the transparent latch circuits 10 and 20, clock skew does not occur.

Preferred embodiments of the present invention have been explained. These embodiments, however, are merely examples. The present invention is not limited to the embodiments and can be provided by variously modifying the embodiments without departing from the scope of the invention.

The invention claimed is:

1. A transparent latch circuit comprising:
a first latch circuit for receiving a data signal and latching the data signal in response to a first signal fluctuating periodically;
a second latch circuit for receiving an output signal of said first latch circuit and latching the output signal of said first latch circuit in response to an unasserted latch stop signal when a test signal is in the active state; and
latch stop means for producing the latch stop signal while receiving the test signal and said first signal and causing said second latch circuit to have the data signal received by the transparent latch circuit pass therethrough when the test signal is in an inactive state and the latch stop signal is asserted.

2. The transparent latch circuit of claim 1, wherein said latch stop means comprises:
a logic gate for receiving the first signal and the test signal, and outputting the unasserted latch stop signal when the test signal is in the active state, or outputting an asserted latch stop signal when the test signal is in the inactive state; and said second latch circuit permits the signal output by the first latch circuit to pass through during a concurrent period when said second latch circuit receives the asserted latch stop signal.

3. A transparent latch circuit comprising:
a slave latch circuit for receiving an output signal from a master latch circuit and latching the output signal in response to a first signal fluctuating periodically;
a master latch circuit for receiving a data signal and a latch stop signal and latching the data signal in response to the unasserted latch stop signal, wherein the latch stop signal is unasserted when a test signal input is in the active state; and
a latch stop means for producing the latch stop signal while receiving the test signal and said first signal and causing said master latch circuit to have the data signal received by the transparent latch circuit pass therethrough when the test signal is in the inactive state and the latch stop signal is asserted.

4. The transparent latch circuit of claim 3, wherein said latch stop means comprises:
a logic gate for receiving the first signal and the test signal, and outputting the unasserted latch stop signal when the test signal is in the active state or outputting an asserted latch stop signal when the test signal is in the inactive state; and
said master latch circuit permits the data signal to pass through during a concurrent period when said master latch circuit receives the asserted latch stop signal.

5. A transparent latch circuit comprising,
at least one first transparent latch circuit having a first latch stop means, a first latch circuit and a second latch circuit, wherein the first latch stop means is coupled to the second latch circuit;
and at least one second transparent latch circuit having a second latch stop means, a third latch circuit, and a fourth latch circuit, wherein the second latch stop means is coupled to the third latch circuit
wherein said first latch stop means causes the second latch circuit to pass an output signal from the first latch circuit therethrough when a test signal is in an active state and wherein said second latch stop means causes the third latch circuit to pass an output signal from a data signal input therethrough when the test signal is in the active state; and
said first and second transparent latch circuits are alternately interconnected.

* * * * *